United States Patent
Kusaba et al.

(10) Patent No.: US 7,311,775 B2
(45) Date of Patent: Dec. 25, 2007

(54) METHOD FOR HEAT-TREATING SILICON WAFER AND SILICON WAFER

(75) Inventors: Tatsumi Kusaba, Takeo (JP); Hidehiko Okuda, Imari (JP); Yoshihisa Nonogaki, Imari (JP)

(73) Assignee: Sumco Corporation, Tokyo (JP)

( * ) Notice: Subject to any disclaimer, the term of this patent is extended or adjusted under 35 U.S.C. 154(b) by 159 days.

(21) Appl. No.: 11/196,480

(22) Filed: Aug. 4, 2005

(65) Prior Publication Data
US 2006/0027161 A1   Feb. 9, 2006

(30) Foreign Application Priority Data
Feb. 9, 2004   (JP) ............................. P2004-032603

(51) Int. Cl.
C30B 25/12   (2006.01)
C30B 25/14   (2006.01)
(52) U.S. Cl. .............................. 117/86; 117/84; 117/89
(58) Field of Classification Search .................. 117/84, 117/86, 89
See application file for complete search history.

(56) References Cited

FOREIGN PATENT DOCUMENTS

| JP | 5-18254 | 12/1985 |
| JP | 3080501 | 9/1994 |
| JP | 06-295913 | 10/1994 |
| JP | 10-144698 | 5/1998 |
| JP | 2000-058552 | 2/2000 |

*Primary Examiner*—Felisa Hiteshew
(74) *Attorney, Agent, or Firm*—Pillsbury Winthrop Shaw Pittman, LLP

(57) ABSTRACT

This method for heat-treating a silicon wafer includes: a step of subjecting a silicon wafer to a high-temperature heat treatment in an ambient gas atmosphere of hydrogen gas, argon gas or a mixture thereof; and a step of lowering a temperature at a rate of 2° C./min or less in a nitrogen-gas-containing ambient atmosphere in a portion or all of a process of lowering a temperature to a wafer removal temperature following said high-temperature heat treatment. This silicon wafer has a defect-free layer which is formed by a high-temperature heat treatment and is included in a surface thereof, wherein an average iron concentration in said surface is $1\times10^{10}$ atoms/cm$^3$ or less.

4 Claims, 1 Drawing Sheet

METHOD FOR HEAT-TREATING SILICON WAFER AND SILICON WAFER

CROSS REFERENCE TO RELATED APPLICATIONS

This application is related to, but does not claim priority from, Japanese Patent Application No. 2004-032603, filed on Feb. 9, 2004, the contents of which are incorporated herein in their entirety by reference.

BACKGROUND OF THE INVENTION

1. Field of the Invention

The present invention relates to a method for heat-treating silicon wafers and to silicon wafers.

2. Background Art

A surface layer portion of a silicon wafer sometimes contains oxygen precipitates and crystal defects having a regular octahedral structure known as crystal originated particles (COP) which are introduced into a crystal during pulling of a silicon single-crystal ingot. When present in the surface layer portion of the wafer where devices are fabricated, these defects cause a deterioration in the gate oxide integrity and other electrical characteristics.

Therefore, in order to improve the gate oxide integrity and other electrical characteristics of the silicon wafer, it is essential for the surface layer portion of the wafer where devices are fabricated to be made a defect-free layer. Numerous reports (e.g., Patent Documents 1 to 5) indicate that in order to form a defect-free layer in a surface layer portion of a silicon wafer and thus improve the gate oxide integrity, it is effective to subject the silicon wafer to a high-temperature heat treatment in an ambient atmosphere of hydrogen, argon, or a gas mixture thereof for several hours.

As disclosed in Patent Document 3 and Patent Document 4, temperature processes in such high-temperature heat treatment typically involve a heat-up process in which a temperature is raised from a wafer loading temperature to 1000° C. at a rate of about 10° C./min and is raised from 1000 to 1200° C. at a rate of 3° C./min or less, a heat treatment which is carried out at about 1200° C. for one hour or more, and a ramp-down process in which the temperature is lowered from 1200° C. to about 1000° C. at a rate of 3° C./min and is lowered at 1000° C. or below at a rate of 10° C./min.

In the ramp-down process, the reason for setting a ramp-down rate to 3° C./min within a temperature range of 1200 to 1000° C. is to allow oxygen precipitates to form in the wafer by lowering the ramp-down rate in this temperature range. The reason for setting the ramp-down rate to 10° C./min within a temperature range of 1000° C. or below is to increase throughput and reduce production costs by raising the ramp-down rate.

In a high-temperature heat treatment in a hydrogen gas-containing ambient atmosphere, it is well-known that a reducing action of the hydrogen gas etches surfaces of a quartz reaction tube and a wafer boat (which is made of quartz, silicon or SiC), thereby, during the heat treatment, a silicon wafer surface is contaminated with impurities present in a parent material, especially heavy metals such as iron, copper and nickel.

There is no effective means for removing heavy metal impurities once they have diffused to the wafer surface as a result of the high-temperature heat treatment. Hence, there exists a need for a method for heat-treating a silicon wafer which does not give rise to heavy metal contamination.

Recently, a high-temperature heat treatment in an ambient atmosphere of argon gas which does not have a reducing effect has been regarded as promising.

However, in our own experiments, we have found that iron concentrations (iron contamination) in a silicon wafer surface were higher than those prior to a high-temperature heat treatment, not only in silicon wafers subjected to a high-temperature heat treatment in a hydrogen-containing ambient atmosphere, but also even in silicon wafers subjected to a high-temperature heat treatment in an ambient atmosphere of argon gas or an ambient atmosphere of argon gas containing a small amount of hydrogen gas mixed therein.

Patent Document 1: Japanese Examined Patent Application, Second Publication No. H05-18254

Patent Document 2: Japanese Patent No. 3080501

Patent Document 3: Japanese Patent Application, First Publication No. H06-295913

Patent Document 4: Japanese Patent Application, First Publication No. H10-144698

Patent Document 5: Japanese Patent Application, First Publication No. 2000-58552

SUMMARY OF THE INVENTION

In light of the above problems, it is an object of the present invention to provide silicon wafers having a defect-free layer in a surface layer portion of the silicon wafer and having a low heavy metal contamination (iron contamination) in a wafer surface. Another object of the present invention is to provide a method for heat-treating a silicon wafer for obtaining such silicon wafers.

As a result of extensive investigations conducted in order to achieve these objects, we have discovered that iron contamination in the wafer surface can be suppressed by keeping a rate for lowering a temperature low in a specific ambient gas atmosphere during a step of lowering a temperature following a high-temperature heat treatment.

Accordingly, a method for heat-treating a silicon wafer of the present invention includes: a step of subjecting a silicon wafer to a high-temperature heat treatment in an ambient gas atmosphere of hydrogen gas, argon gas or a mixture thereof; and a step of lowering a temperature at a rate of 2° C./min or less in a nitrogen-gas-containing ambient atmosphere in a portion or all of a process of lowering a temperature to a wafer removal temperature following said high-temperature heat treatment.

According to the present invention, a sufficient defect-free layer can be achieved in the surface layer portion of the wafer, and iron contamination in the wafer surface can be suppressed. Although the reason for the decrease in iron contamination is not yet understood, in the case in which a temperature is lowered at a rate greater than 2° C./min in a nitrogen-gas-containing ambient atmosphere, this desirable effect is not obtained; nor is this effect obtained in the case in which a temperature is lowered at a rate of 2° C./min or less in an ambient gas atmosphere other than a nitrogen-gas-containing ambient atmosphere. We have found that this effect occurs only when both conditions of the gas ambient atmosphere and the rate for lowering a temperature are completed.

It is desirable for the ambient gas atmosphere used in the high-temperature heat treatment of the present invention to be 100% hydrogen gas, 100% argon gas, or an ambient mixed gas atmosphere composed of argon gas containing a small amount of hydrogen gas mixed therein. The ambient gas atmosphere during lowering a temperature is preferably 100% nitrogen gas, although it may instead be an ambient gas atmosphere composed of nitrogen gas containing a small amount of a non-oxidizing gas (argon gas, hydrogen gas and the like) mixed therein. The rate for lowering a temperature is more preferably 1° C./min or less. However, if the rate for lowering a temperature is too slow, the throughput will become very long, which is undesirable in terms of productivity. From this standpoint, it is preferable to ensure a rate for lowering a temperature of 0.5° C./min or more.

In the method for heat-treating a silicon wafer of the present invention, the lowering a temperature at a rate of 2° C./min or less in a nitrogen-gas-containing ambient atmosphere may be carried out in a temperature range of 700° C. or less during the process of lowering a temperature. This enables iron contamination of the wafer surface to be further suppressed.

A sufficient effect of suppressing iron contamination is achieved in the wafer surface by carrying out all the process of lowering a temperature at a rate of 2° C./min or less in a nitrogen-gas-containing ambient atmosphere. However, in the case in which a gas replacement to a nitrogen-gas-containing ambient atmosphere is carried out in a temperature range of more than 700° C., nitrides are formed in the wafer surface, making it necessary to add a new step to remove the nitrides. Hence, the gas replacement to the nitrogen-gas-containing ambient atmosphere is preferably conducted in a temperature range of 700° C. or less, and the gas replacement in a temperature range of 650° C. or less is especially preferred. Also, because the effect of suppressing iron contamination cannot be achieved even if the gas replacement to the nitrogen-gas-containing ambient atmosphere is administered in a low temperature range of less than 500° C., the gas replacement must be carried out in a temperature range of 500° C. or more. Accordingly, in order to suppress both nitride formation and iron contamination, it is advantageous for lowering a temperature to be carried out in a temperature range from 650° C. or less to 500° C. or more and in a nitrogen-gas-containing ambient atmosphere.

In the practice of the present invention, the high-temperature heat treatment carried out on the silicon wafer may be a heat treatment in a temperature range of 900 to 1350° C. for one hour or more. At less than 900° C., defects such as COPs and oxygen precipitates in the surface layer portion in the wafer cannot be reduced sufficiently, whereas at more than 1350° C., defects such as slip dislocations may be newly introduced in the wafer. Also, at a heat treatment time of less than one hour, defects such as COPs and oxygen precipitates in the surface layer portion in the wafer cannot be reduced sufficiently. Lengthening the heat treatment time is effective for eliminating defects such as COPs, but this leads to greater production costs due to an increase in a cycle time and an increased burden (wear and tear) on an equipment. Therefore, it is desirable to limit the heat treatment time to less than 12 hours at a maximum.

The silicon wafer of the present invention has a defect-free layer which is formed by a high-temperature heat treatment and is included in a surface thereof, wherein an average iron concentration in the surface is $1\times10^{10}$ atoms/cm$^3$ or less.

According to the present invention, by subjecting a silicon wafer to a high-temperature heat treatment in an ambient gas atmosphere of hydrogen gas, argon gas or a gas mixture thereof, and then lowering a temperature at a rate of 2° C./min or less in a nitrogen-gas-containing ambient atmosphere in a portion or all of a process of lowering a temperature to a wafer removal temperature, a sufficiently defect-free layer can be achieved in the surface layer portion of the wafer and iron contamination can be adequately suppressed in the wafer surface. Moreover, although the wafer of the present invention is an annealed wafer heat-treated at a high temperature, it is of a high quality characterized by an average iron concentration in the silicon wafer surface of $1\times10^{10}$ atoms/cm$^3$ or less, enabling remarkable improvements to be made in device characteristics.

PREFERRED EMBODIMENTS

Figure 1:
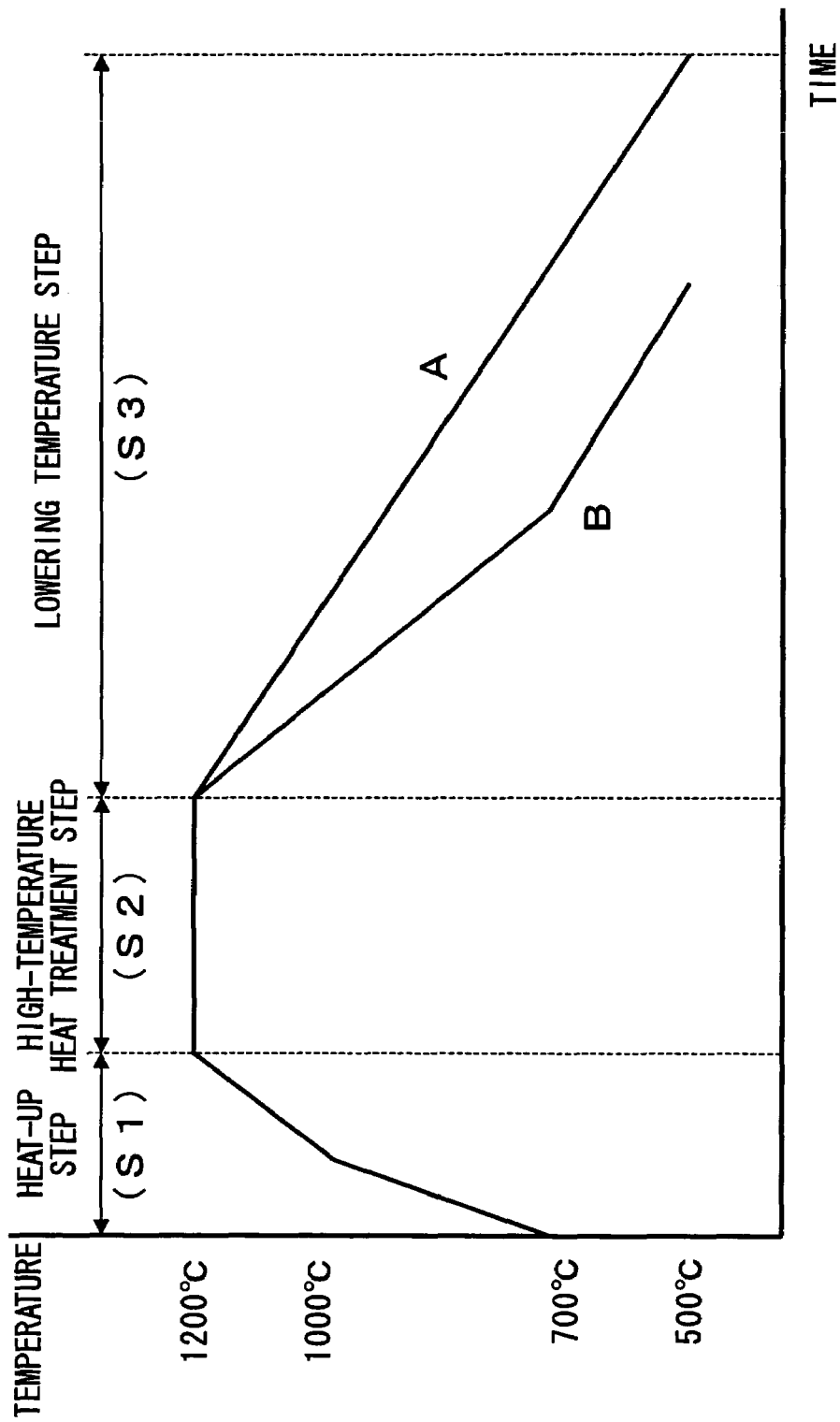
FIG. 1 is a graph showing heat treatment temperature conditions in examples of the present invention and in comparative examples.

Embodiments of a method for heat-treating a silicon wafer of the present invention is described below with reference to FIG. 1.

Silicon wafers are prepared by known operations such as slicing, lapping, grinding, polishing and cleaning treatment from silicon single-crystal ingots grown by the Czochralski method (CZ method).

The silicon wafers are loaded on a thermal processing boat, after which the silicon wafers are introduced into a thermal processing furnace having an argon ambient atmosphere. As shown in FIG. 1, in a heat-up step S1, a temperature of the silicon wafers is raised at a given heat-up rate to a temperature of a high-temperature heat treatment. When the heat treatment is carried out in a hydrogen gas ambient atmosphere or a mixed gas ambient atmosphere of hydrogen gas and argon gas, it is necessary to eliminate a danger of an explosion due to contact between an outside atmosphere and the hydrogen gas. To this end, the thermal processing boat is loaded into the thermal processing furnace while an interior of the furnace is under a nitrogen gas ambient atmosphere, and then the interior of the furnace is replaced with the hydrogen gas ambient atmosphere or the mixed gas ambient atmosphere of hydrogen gas and argon gas. Thereafter the heat-up is begun. The heat-up rate employed in the heat-up step SI may be any suitable rate and may be suitably selected according to various wafer conditions. Also, any suitable thermal processing apparatus may be used to work the present invention, such as a vertical thermal processing apparatus, a horizontal thermal processing apparatus, or a thermal processing apparatus for single wafers.

In a high-temperature heat treatment step S2, heat treatment is carried out in a temperature range of 900 to 1350° C. for one hour or more. This results in the formation in the wafer surface of a defect-free layer in which COPs and oxygen precipitates are absent.

Next, in a lowering temperature step S3, the interior of the thermal processing furnace is changed to a nitrogen gas ambient atmosphere, and the temperature is lowered at a rate of 2° C./min or less. This enables iron contamination of the wafer surface to be suppressed. Here, following completion of the high-temperature heat treatment step S2, the interior of the thermal processing furnace may be immediately flushed with a nitrogen-gas-containing ambient atmosphere and a temperature may be started to be lowered at a rate of 2° C./min or less (line A). However, in such a case, the throughput in the lowering temperature step S3 as a whole becomes longer and nitride formation occurs in the wafer surface. Therefore, following completion of the high-temperature heat treatment step S2, it is desirable to initially lower the temperature at a lowering rate of more than 2°

C./min, then change to a nitrogen gas ambient atmosphere at a temperature range of 700° C. or less and subsequently start lowering a temperature at a rate of 2° C./min or less (line B). In this way, both nitride formation and iron contamination can be suppressed.

EXAMPLES

The method for heat-treating a silicon wafer of the present invention is illustrated in the following examples. Specifically, heat treatment experiments were carried out in which relationship between the ambient gas atmosphere and a lowering rate during lowering a temperature in the heat treatment of the silicon wafers was varied and iron concentration detected in the wafer surface was measured. Those heat treatment conditions and results obtained are described below.

The silicon wafers used in each experiment were all boron-doped p-type silicon wafers which had a diameter of 200 mm and a crystal plane orientation of (100) and had been cut from a single-crystal silicon ingot grown by the Czochralski (CZ) method, and mirror polished.

Common heat treatment conditions in the examples of the present invention and comparative examples were as follows. The above-described silicon wafers were loaded into a vertical thermal processing boat, and then the boat was placed in a thermal processing furnace. A temperature in the furnace was raised to 1000° C. at a fixed heat-up rate of 10° C./min, and then the heat-up rate was changed to 1° C./min. Once the temperature had reached 1200° C., the temperature was held at that level and a heat treatment of the wafer was carried out for one hour.

In Example 1 of the present invention, high-temperature heat treatment at 1200° C. in an argon gas ambient atmosphere was carried out for one hour, and then an interior of the thermal processing furnace was immediately changed to a 100% nitrogen gas ambient atmosphere and the temperature was lowered to 500° C. at a lowering rate of 2° C./min.

In Example 2 of the present invention, high-temperature heat treatment at 1200° C. in an argon gas ambient atmosphere was carried out for one hour, and then the interior of the thermal processing furnace was immediately changed to a 100% nitrogen gas ambient atmosphere and the temperature was lowered to 500° C. at a lowering rate of 1° C./min.

In Example 3 of the present invention, high-temperature heat treatment at 1200° C. in an argon gas ambient atmosphere was carried out for one hour. Next, while retaining the argon gas ambient atmosphere in the thermal processing furnace, the temperature was lowered to 1000° C. at a lowering rate of 3° C./min, and subsequently lowered to 700° C. at a lowering rate of 10° C./min. The interior of the furnace was then changed to a 100% nitrogen gas ambient atmosphere and the temperature was lowered to 500° C. at a lowering rate of 2° C./min.

In Example 4 of the present invention, high-temperature heat treatment at 1200° C. in an argon gas ambient atmosphere was carried out for one hour. Next, while retaining the argon gas ambient atmosphere in the thermal processing furnace, the temperature was lowered to 1000° C. at a lowering rate of 3° C./min, and subsequently lowered to 700° C. at a lowering rate of 10° C./min. The interior of the furnace was then changed to a 100% nitrogen gas ambient atmosphere and the temperature was lowered to 500° C. at a lowering rate of 1° C./min.

In Comparative Example 1, high-temperature heat treatment at 1200° C. in an argon gas ambient atmosphere was carried out for one hour. While retaining the argon gas ambient atmosphere in the thermal processing furnace, the temperature was then lowered to 500° C. at a lowering rate of 3° C./min.

In Comparative Example 2, high-temperature heat treatment at 1200° C. in an argon gas ambient atmosphere was carried out for one hour. While retaining the argon gas ambient atmosphere in the thermal processing furnace, the temperature was then lowered to 500° C. at a lowering rate of 1° C./min.

In Comparative Example 3, high-temperature heat treatment at 1200° C. in an argon gas ambient atmosphere was carried out for one hour. And then, the interior of the thermal processing furnace was immediately changed to a 100% nitrogen gas ambient atmosphere and the temperature was lowered to 500° C. at a lowering rate of 3° C./min.

In Comparative Example 4, high-temperature heat treatment at 1200° C. in an argon gas ambient atmosphere was carried out for one hour. While retaining the argon gas ambient atmosphere in the thermal processing furnace, the temperature was then lowered to 1000° C. at a lowering rate of 3° C./min, and subsequently lowered to 700° C. at a lowering rate of 10° C./min. The interior of the thermal processing furnace was then changed to a 100% nitrogen gas ambient atmosphere and the temperature was lowered to 500° C. at a lowering rate of 3° C./min.

In Comparative Example 5, high-temperature heat treatment at 1200° C. in an argon gas ambient atmosphere was carried out for one hour. While retaining the argon gas ambient atmosphere in the thermal processing furnace, the temperature was then lowered to 1000° C. at a lowering rate of 3° C./min, then lowered to 700° C. at a lowering rate of 10° C./min, and finally lowered to 500° C. at a lowering rate of 1° C./min.

Each of the silicon wafers obtained in above Examples 1 to 4 of the present invention and each of the silicon wafers obtained in Comparative Examples 1 to 5 was subjected to a measurement of an in-plane average concentration of iron in the wafer surface using surface photo voltage (SPV) spectroscopy. In addition, the surface of each wafer was examined by x-ray photoelectron spectroscopy (XPS) for evidence of nitride formation thereon. The results are given in Table 1.

TABLE 1

|  | Temperature range | Ambient gas atmosphere | Lowering rate | Fe concentration (atoms/cm$^3$) | Presence of nitrides |
|---|---|---|---|---|---|
| Example 1 | 1200° C. to 500° C. | nitrogen gas | 2° C./min | <1 × 10$^{10}$ | yes |
| Example 2 | 1200° C. to 500° C. | nitrogen gas | 1° C./min | <1 × 10$^{10}$ | yes |
| Example 3 | 1200° C. to 700° C. 700° C. to 500° C. | argon gas nitrogen gas | 2° C./min | <1 × 10$^{10}$ | no |

TABLE 1-continued

|  | Temperature range | Ambient gas atmosphere | Lowering rate | Fe concentration (atoms/cm$^3$) | Presence of nitrides |
|---|---|---|---|---|---|
| Example 4 | 1200° C. to 700° C.<br>700° C. to 500° C. | argon gas<br>nitrogen gas | 1° C./min | <1 × 10$^{10}$ | no |
| Comparative Example 1 | 1200° C. to 500° C. | argon gas | 3° C./min | >1 × 10$^{10}$ | no |
| Comparative Example 2 | 1200° C. to 500° C. | argon gas | 1° C./min | >1 × 10$^{11}$ | no |
| Comparative Example 3 | 1200° C. to 500° C. | nitrogen gas | 3° C./min | >1 × 10$^{11}$ | yes |
| Comparative Example 4 | 1200° C. to 700° C.<br>700° C. to 500° C. | argon gas<br>nitrogen gas | 3° C./min | >5 × 10$^{10}$ | no |
| Comparative Example 5 | 1200° C. to 700° C.<br>700° C. to 500° C. | argon gas<br>argon gas | 1° C./min | >5 × 10$^{10}$ | no |

As is apparent from Table 1, in Examples 1 to 4 of the present invention, the average iron concentration detected in the surface of the silicon wafers was 1×10$^{10}$ atoms/cm$^3$ or less in each case, indicating a satisfactory effect of reducing iron contamination. In particular, in the wafers obtained in Examples 3 and 4 of the present invention in which a replacement of nitrogen gas was carried out at 700° C. or less, the wafers were found to be of a high quality with no observable nitride formation in the wafer surface. On the other hand, the wafers obtained in Comparative Examples 1 to 5 exhibited high levels of iron contamination with 5×10$^{10}$ atoms/cm$^3$ or more irons detected in each wafer.

Each of the silicon wafers obtained in Examples 1 to 4 of the present invention and in Comparative Examples 1 to 5 was cleaved and a cleavage face was subjected to Wright etching treatment, then examined under an optical microscope to determine a thickness of a defect-free layer formed in a surface layer portion of the wafer. A defect-free layer of 10 μm or more was found to have been formed in the surface layer portion in each wafer.

Here, although high-temperature heat treatment was carried out in an argon gas ambient atmosphere in each of the examples of the present invention and in the comparative examples, the method of the present invention is not limited to the use of an argon gas ambient atmosphere in this step. Substantially similar results were obtained when high temperature heat treatment was carried out in hydrogen gas or in argon gas containing a small amount of hydrogen (10%).

Since the silicon wafer of the present invention is heat-treated at high temperature, the defect-free layer is formed in the surface thereof. Accordingly, the wafer has an excellent gate oxide integrity. Moreover, because the silicon wafer of the present invention has a very low level of iron contamination in the surface thereof, it functions effectively as a wafer in which defects in device characteristics do not arise.

Preferred embodiments of the present invention have been described above, although these embodiments are to be considered in all respects as illustrative and not limitative. Those skilled in the art will appreciate that various additions, omissions, substitutions and other modifications are possible without departing from the spirit and scope of the present invention as disclosed in the accompanying claims.

What is claimed is:

1. A method for heat-treating a silicon wafer, the method comprising:

subjecting a silicon wafer to a high-temperature heat treatment in an ambient gas atmosphere of hydrogen gas, argon gas or a mixture thereof; and lowering a temperature at a rate of 2° C./min or less in a nitrogen-gas-containing ambient atmosphere in a portion or all of a process of lowering a temperature to a wafer removal temperature following said high-temperature heat treatment.

2. The method for heat-treating a silicon wafer according to claim 1, wherein said lowering a temperature at a rate of 2° C./min or less in a nitrogen-gas-containing ambient atmosphere is carried out in a temperature range of 700° C. or less during said process of lowering a temperature.

3. The method for heat-treating a silicon wafer according to claim 2, wherein said high-temperature heat treatment is a heat treatment in a temperature range of 900 to 1350° C. for one hour or more.

4. The method for heat-treating a silicon wafer according to claim 1, wherein said high-temperature heat treatment is a heat treatment in a temperature range of 900 to 1350° C. for one hour or more.

* * * * *